United States Patent [19]
Koh et al.

[11] Patent Number: 5,753,546
[45] Date of Patent: May 19, 1998

[54] METHOD FOR FABRICATING METAL OXIDE FIELD EFFECT TRANSISTORS

[75] Inventors: Yo Hwan Koh; Seong Min Hwang, both of Ichon, Rep. of Korea

[73] Assignee: Hyundai Electronics Industries Co., Ltd., Ichon-kun, Rep. of Korea

[21] Appl. No.: 666,214

[22] Filed: Jun. 20, 1996

[30] Foreign Application Priority Data

Jun. 30, 1995 [KR] Rep. of Korea .................. 95-18862

[51] Int. Cl.⁶ .................................. H01L 21/8238
[52] U.S. Cl. ................. 438/229; 438/230; 438/593; 438/596; 438/655
[58] Field of Search .................. 438/229, 230, 438/267, 592, 593, 595, 596, 682, 683, 655

[56] References Cited

U.S. PATENT DOCUMENTS

| | | | |
|---|---|---|---|
| 4,584,760 | 4/1986 | Okazawa | 438/655 |
| 4,660,276 | 4/1987 | Hsu | 438/655 |
| 4,716,131 | 12/1987 | Okazawa et al. | 438/592 |
| 5,081,066 | 1/1992 | Kim . | |
| 5,221,853 | 6/1993 | Joshi et al. . | |
| 5,247,198 | 9/1993 | Homma et al. . | |
| 5,256,585 | 10/1993 | Bae | 438/596 |
| 5,545,578 | 8/1996 | Park et al. | 438/592 |
| 5,576,228 | 11/1996 | Chen et al. | 438/655 |
| 5,599,725 | 2/1997 | Dorleans et al. | 438/592 |

*Primary Examiner*—Tuan H. Nguyen
*Attorney, Agent, or Firm*—Reid & Priest LLP

[57] ABSTRACT

A method for fabricating a metal oxide silicon field effect transistor (MOSFET) wherein a polysilicon layer is deposited over a gate oxide film serving to insulate the gate of the MOSFET from the substrate of the MOSFET. The polysilicon layer serves to prevent the gate oxide film from being etched upon forming a gate electrode using a metal film or metal silicide side walls as a mask. Accordingly, it is possible to prevent a short circuit from occurring between the semiconductor substrate and gate electrode of the MOSFET upon forming the gate electrode.

19 Claims, 4 Drawing Sheets

METHOD FOR FABRICATING METAL OXIDE FIELD EFFECT TRANSISTORS

BACKGROUND OF THE INVENTION

1. Field of the Invention

The present invention relates to a method for fabricating metal oxide field effect transistors (MOSFET's), and more particularly to a method for fabricating MOSFET's, which involves forming gate electrodes using a metal film or metal silicide film.

2. Description of the Prior Art

In order to achieve a high integration of semiconductor devices, various methods have been used. For example, a method for forming a thin conduction layer for gate electrodes of MOSFET's is known. A scaling principle relating to the formation of gates for achieving the high integration is also known. The scaling principle explains that MOSFET's should have a thinner gate oxide film for further increasing the transconductance in its transistor channel.

Referring to FIGS. 1 to 4, a conventional method for fabricating a MOSFET with a thin gate electrode is illustrated.

In accordance with this method, a semiconductor substrate 1 is first prepared, as shown in FIG. 1. Over the semiconductor substrate 1, a gate oxide film 2, a polysilicon layer and an insulating film are sequentially laminated. Thereafter, a gate patterning step is carried out to form a polysilicon layer pattern 3 and an insulating film pattern 4. After etching the polysilicon layer pattern, the gate oxide film 2 still remains without being etched.

Over the entire upper surface of the resulting structure, a metal film 5 is then deposited to a thickness of 100 to 1,000 Å, as shown in FIG. 2. The metal film 5 is made of W, Ta, Ti, Mo, Pt, Ni or Co.

Subsequently, an annealing step is carried out so that the metal film 5 can react with the polysilicon layer pattern 3, thereby forming a silicide film 6 on both side walls of the polysilicon layer pattern 3, as shown in FIG. 3. At this time, the metal film 5 does not react with the gate oxide film 2 and insulating film pattern 4. Accordingly, the metal film 5 is not changed into its silicide at its portions disposed on the gate oxide film 2 and insulating film pattern 4.

Thereafter, the remaining metal film 5 disposed on the gate oxide film 2 and insulating film pattern 4 is removed in accordance with an isotropic etch process using the difference in etch selectivity between the metal film 5 and metal silicide film 6, as shown in FIG. 4. Thus, a gate electrode 9 is obtained which consists of the polysilicon layer pattern 3 and metal silicide film 6.

In accordance with the above-mentioned conventional method, however, there is a problem in that when the polysilicon layer is etched to form the polysilicon layer pattern 3, the gate oxide film 2 may be undesirably etched. If subsequent steps are carried out under the condition that the gate oxide film 2 has been etched, a silicide film may be formed on the semiconductor substrate as well as the gate oxide film 2. In this case, a short circuit may occur between the semiconductor substrate and gate electrode.

SUMMARY OF THE INVENTION

Therefore, an object of the invention is to solve the above-mentioned problem involved in the prior art and to provide a method for fabricating a MOSFET, capable of preventing a short circuit from occurring between the semiconductor substrate and gate electrode of the MOSFET in spite of the formation of a thin gate oxide film, thereby not only eliminating a degradation in the characteristics of the MOSFET caused by a damage of the MOSFET, but also achieving an improvement in process margin.

In accordance with one aspect, the present invention provides a method for fabricating a metal oxide silicon field effect transistor, comprising the steps of: sequentially laminating a gate oxide film, a first polysilicon layer, an insulating film, a second polysilicon layer over a semiconductor substrate, and partially etching the second polysilicon layer, thereby forming a second-polysilicon layer pattern; forming an insulating film pattern on the resulting structure obtained after the partial etching of the first polysilicon layer by use of the second-polysilicon layer pattern as a mask; depositing a metal film over the resulting structure obtained after the formation of the insulating film pattern; anisotropically etching the metal film, thereby forming metal film side walls respectively on both side walls of the second-polysilicon layer pattern; and etching the first polysilicon layer and the gate oxide film by use of the second-polysilicon layer pattern and the metal film side walls as a mask, thereby forming a gate.

In accordance with another aspect, the present invention provides a method for fabricating a metal oxide silicon field effect transistor, comprising the steps of: sequentially laminating a gate oxide film, a first polysilicon layer, an insulating film, a second polysilicon layer over a semiconductor substrate, and patterning the second polysilicon layer and the insulating film in accordance with a gate patterning process, thereby forming a second-polysilicon layer pattern and an insulating film pattern, and then forming a metal film over the resulting structure; anisotropically etching the metal film, thereby forming metal film side walls respectively on both side walls of the second-polysilicon layer pattern; annealing the metal film, thereby reacting the metal film with the second-polysilicon layer pattern and the first polysilicon layer which are in contact therewith, thereby forming a metal silicide film; and etching the first polysilicon layer and the gate oxide film by use of the second-polysilicon layer pattern and the metal silicide film as a mask, thereby forming a gate which has a polycide structure consisting of the second-polysilicon layer pattern, the metal silicide film, the first-polysilicon layer pattern and the insulating film pattern.

In accordance with another aspect, the present invention provides a method for fabricating a metal oxide silicon field effect transistor, comprising the steps of: sequentially laminating a gate oxide film, a first polysilicon layer, an insulating film, a second polysilicon layer over a semiconductor substrate, and patterning the second polysilicon layer and the insulating film in accordance with a gate patterning process, thereby forming a second-polysilicon layer pattern and an insulating film pattern, and then forming a metal film over the resulting structure; annealing the metal film, thereby reacting the metal film with the second-polysilicon layer pattern and the first polysilicon layer which are in contact therewith, thereby forming a metal silicide film while patterning the first polysilicon layer; and anisotropically etching the metal silicide film, thereby forming metal silicide film side walls respectively on both side walls of the second-polysilicon layer pattern, thereby forming a gate which has a polycide structure consisting of the second-polysilicon layer pattern, the metal silicide film side walls, the first-polysilicon layer pattern and the insulating film pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 5 to 8, a method for forming gate electrodes of a MOSFET in accordance with a first embodiment of the present invention is illustrated.

Figure 1:
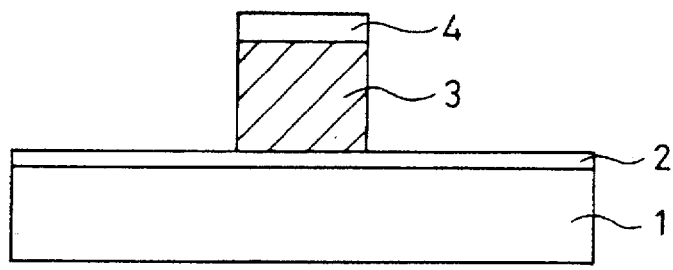
FIGS. 1 to 4 are sectional views respectively illustrating a conventional method for fabricating a MOSFET.
Figure 2:
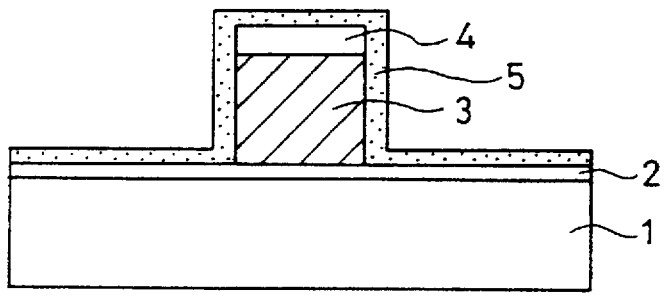
Figure 3:
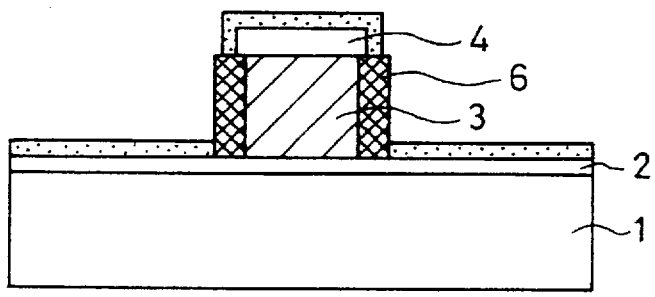
Figure 4:
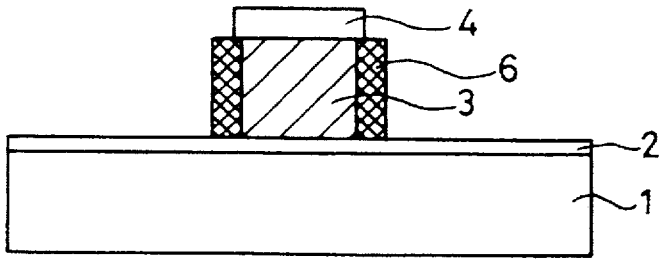
Figure 5:
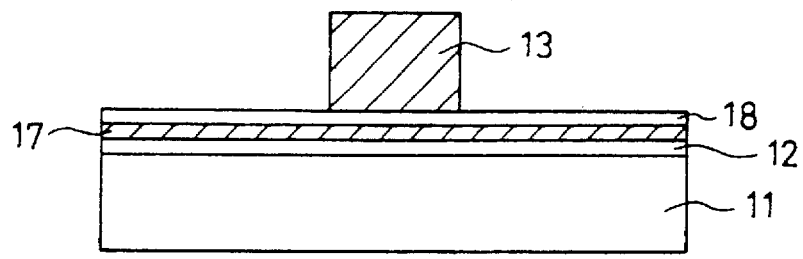
FIGS. 5 to 8 are sectional views respectively illustrating a method for forming gate electrodes of a MOSFET in accordance with a first embodiment of the present invention.

In accordance with the method of the present invention, a semiconductor substrate 11 is first prepared, as shown in FIG. 5. Over the semiconductor substrate 11, a gate oxide film 12 and a first polysilicon layer 17 are sequentially laminated. Over the first polysilicon layer 17, an insulating film 18 is deposited to a thickness of 50 to 500 Å. A second polysilicon layer is then formed to a thickness of 100 to 500 Å over the insulating film 18. Thereafter, a gate patterning step is carried out to pattern the second polysilicon layer, thereby forming a second-polysilicon layer pattern 13. At this step, the second polysilicon layer is etched until the insulating film 18 is exposed.

Figure 6:
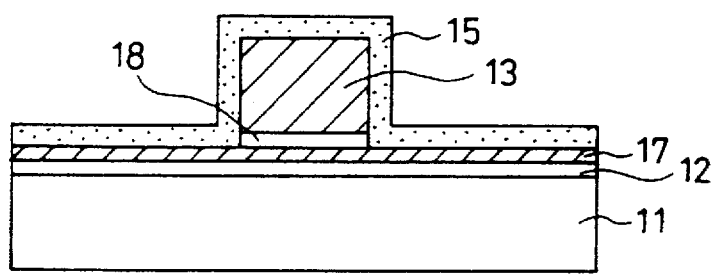

Using the second-polysilicon layer pattern 13 as a mask, the exposed insulating film 18 is then etched, as shown in FIG. 6. At this time, the portion of the insulating film 18 disposed beneath the second-polysilicon layer pattern 13 still remains without being etched. Subsequently, a metal film 15 is deposited to a thickness of 100 to 1,000 Å over the entire exposed surface of the resulting structure including the exposed surface of the second polysilicon layer pattern 13 and the exposed surface of the first polysilicon layer 17.

Figure 7:
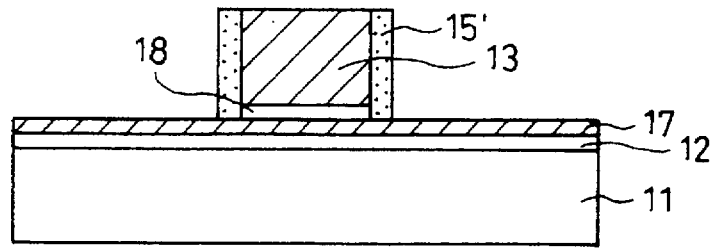

The metal film 15 is then anisotropically etched, thereby respectively forming metal film side walls 15' on the side surfaces of the second-polysilicon layer pattern 13, as shown in FIG. 7. The metal film side walls 15' serve to electrically connect the second-polysilicon layer pattern 13 and first polysilicon layer 17 to each other.

Figure 8:
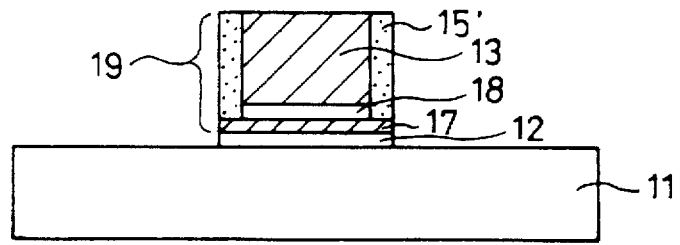

Using the second-polysilicon layer pattern 13 and metal film side walls 15' as a mask, the first polysilicon layer 17 and gate oxide film 12 are then etched, as shown in FIG. 8. Thus, a gate electrode 19 is obtained which consists of the second-polysilicon layer pattern 13, metal film side walls 15', patterned first polysilicon layer 17 and patterned insulating film 18. The gate electrode 19 has a structure with metal side walls.

In accordance with the embodiment of the present invention shown in FIGS. 5 to 8, the gate oxide film 12 disposed beneath the gate electrode 19 is not etched in spite of its small thickness because the first polysilicon layer 17 serves as an etch barrier film. Since the gate oxide film 12 is protected by the first polysilicon layer 17, it can prevent a connection between the gate electrode 19 and substrate 11. Thus, it is possible to prevent the semiconductor device from being damaged.

FIGS. 9 to 12 are sectional views respectively illustrating a method for forming gate electrodes of a MOSFET in accordance with a second embodiment of the present invention.

Figure 9:
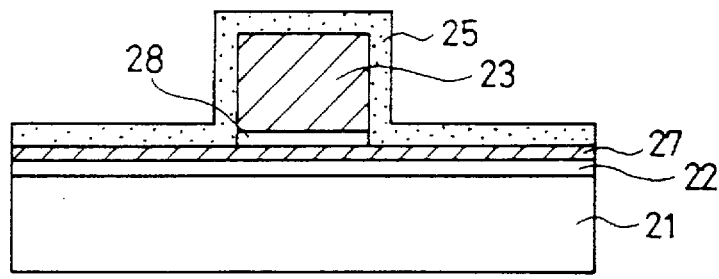
FIGS. 9 to 12 are sectional views respectively illustrating a method for forming gate electrodes of a MOSFET in accordance with a second embodiment of the present invention.

In accordance with the method of the present invention, a semiconductor substrate 21 is first prepared, as shown in FIG. 9. Over the semiconductor substrate 21, a gate oxide film 22 and a first polysilicon layer 27 are sequentially laminated. Over the first polysilicon layer 27, an insulating film is deposited to a thickness of 50 to 500 Å. A second polysilicon layer is then formed to a thickness of 100 to 500 Å over the insulating film. Thereafter, a gate patterning step is carried out to pattern the second polysilicon layer along with the insulating film, thereby forming a second-polysilicon layer pattern 23 and an insulating film pattern 28. Subsequently, a metal film 25 is deposited to a thickness of 100 to 1,000 Å over the entire exposed surface of the resulting structure.

Figure 10:
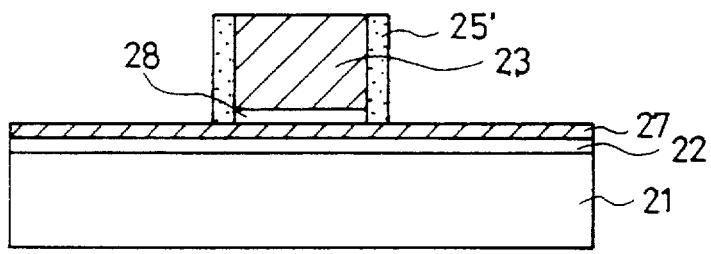

The metal film 25 is then anisotropically etched, thereby respectively forming metal film side walls 25' on the side surfaces of the second-polysilicon layer pattern 23, as shown in FIG. 10.

Figure 11:
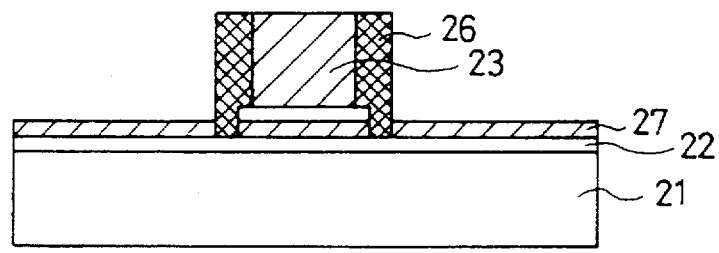

Subsequently, an annealing step is carried out so that the metal film 25 can react with the second-polysilicon layer pattern 23 and first polysilicon layer 27 which are in contact therewith, thereby forming a metal silicide film 26, as shown in FIG. 11.

The metal silicide film 26 serves to electrically connect the second-polysilicon layer pattern 23 with the first polysilicon layer 27.

Figure 12:
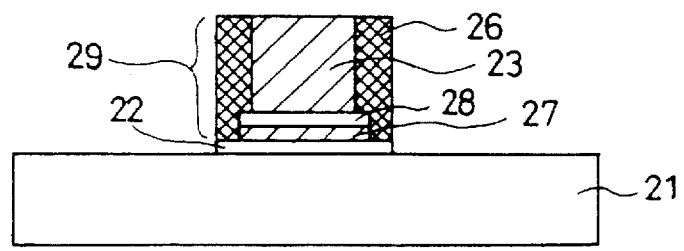

Using the second-polysilicon layer pattern 23 and metal silicide film 26 as a mask, the first polysilicon layer 27 and gate oxide film 22 are then etched, as shown in FIG. 12. Thus, a gate electrode 29 is obtained which consists of the second-polysilicon layer pattern 23, metal silicide film 26, patterned first polysilicon layer 27 and insulating film pattern 28. The gate oxide film 22 disposed beneath the gate electrode 29 is not etched in spite of its small thickness because the first polysilicon layer 27 serves as an etch barrier film.

FIGS. 13 to 16 are sectional views respectively illustrating a method for forming gate electrodes of a MOSFET in accordance with a third embodiment of the present invention.

Figure 13:
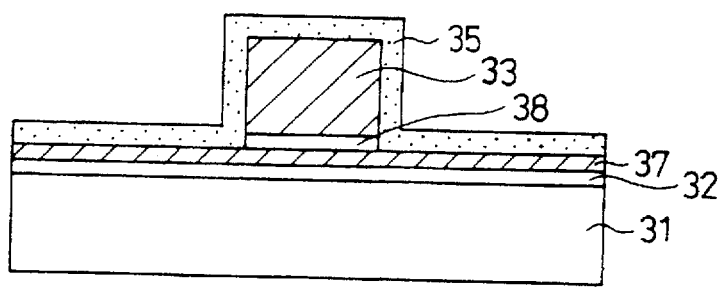
FIGS. 13 to 16 are sectional views respectively illustrating a method for forming gate electrodes of a MOSFET in accordance with a third embodiment of the present invention.

In accordance with the method of the present invention, a semiconductor substrate 31 is first prepared, as shown in FIG. 13. Over the semiconductor substrate 31 a gate oxide film 32 is laminated. Over the first polysilicon layer 37, an insulating film is deposited to a thickness of 50 to 500 A. A second polysilicon layer is then formed to a thickness of 100 to 500 Å over the insulating film. Thereafter, a gate patterning step is carried out to pattern the second polysilicon layer, insulating film and first polysilicon layer, thereby forming a second-polysilicon layer pattern 33 and an insulating film pattern 38. Subsequently, a metal film 35 is deposited to a thickness of 100 to 1,000 Å over the entire exposed surface of the resulting structure.

Figure 14:
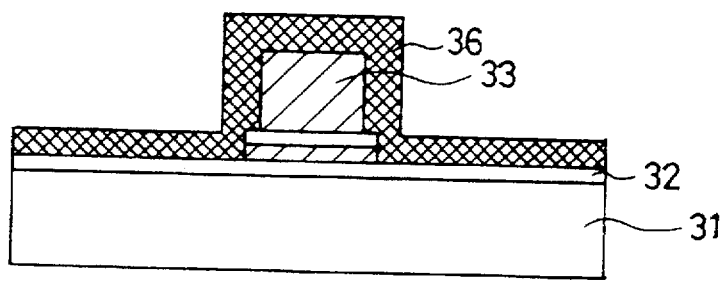

Subsequently, an annealing step is carried out so that the metal film 35 can react with the second-polysilicon layer pattern 33 and first polysilicon layer 37 which are in contact therewith, thereby forming a metal silicide film 36, as shown in FIG. 14.

Figure 15:
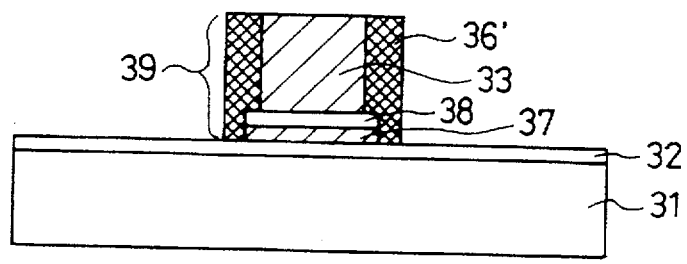

The metal silicide film 36 is then anisotropically etched, thereby respectively forming metal film side walls 36' on the side surfaces of the second-polysilicon layer pattern 33, as shown in FIG. 15. Thus, a gate electrode 39 is obtained which consists of the second-polysilicon layer pattern 33, metal film side walls 361, patterned first polysilicon layer 37 and patterned insulating film 38.

Figure 16:
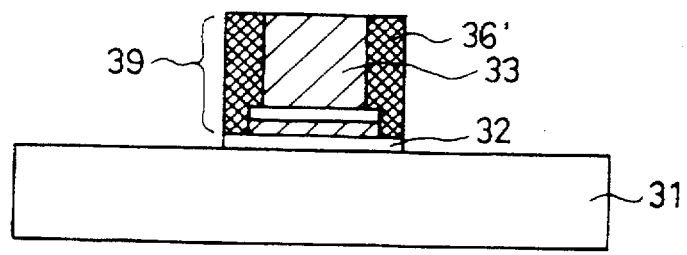

FIG. 16 is a sectional view showing the etched condition of the gate oxide film 32 using the second-polysilicon layer pattern 33, metal film side walls 36', patterned first polysilicon layer 37 and patterned insulating film 38 as a mask. The gate oxide film 32 disposed beneath the gate electrode 39 is not etched in spite of its small thickness because the first polysilicon layer 37 serves as an etch barrier film. The gate oxide film may not be etched.

As apparent from the above description, the present invention provides a method for fabricating a MOSFET wherein a polysilicon layer is deposited over a gate oxide film serving to insulate the gate of the MOSFET from the substrate of the MOSFET. The polysilicon layer serves to prevent the gate oxide film from being etched upon forming a gate electrode using a metal film or metal silicide side walls as a mask. Accordingly, it is possible to prevent a short circuit from occurring between the semiconductor substrate and gate electrode of the MOSFET, thereby achieving an improvement in reliability of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a metal oxide silicon field effect transistor, comprising the steps of:

sequentially laminating a gate oxide film, a first polysilicon layer, an insulating film, a second polysilicon layer over a semiconductor substrate, and partially etching the second polysilicon layer, thereby forming a second-polysilicon layer pattern;

forming an insulating film pattern on the resulting structure obtained after the partial etching of the second polysilicon layer by use of the second-polysilicon layer pattern as a mask;

depositing a metal film over the resulting structure obtained after the formation of the insulating film pattern;

anisotropically etching the metal film, thereby forming metal film side walls respectively on both side walls of the second-polysilicon layer pattern; and etching the first polysilicon layer and the gate oxide film by use of the second-polysilicon layer pattern and the metal film side walls as a mask, thereby forming a gate.

2. The method in accordance with claim 1, wherein the gate oxide film is not etched at its portion disposed beneath the gate upon the etching thereof.

3. The method in accordance with claim 1, wherein the metal film is selected from a group consisting of W, Ta, Ti, Mo, Pt, Ni and Co.

4. The method in accordance with claim 1, wherein the metal film has a thickness of 100 to 1,000 Å.

5. The method in accordance with claim 1, wherein the first polysilicon layer has a thickness of 100 to 500 Å.

6. The method in accordance with claim 1, wherein the insulating film has a thickness of 50 to 500 Å.

7. A method for fabricating a metal oxide silicon field effect transistor, comprising the steps of:

sequentially laminating a gate oxide film, a first polysilicon layer, an insulating film, a second polysilicon layer over a semiconductor substrate, and patterning the second polysilicon layer and the insulating film in accordance with a gate patterning process, thereby forming a second-polysilicon layer pattern and an insulating film pattern, and then forming a metal film over the resulting structure;

anisotropically etching the metal film, thereby forming metal film side walls respectively on both side walls of the second-polysilicon layer pattern;

annealing the metal film, thereby reacting the metal film with the second-polysilicon layer pattern and the first polysilicon layer which are in contact therewith, thereby forming a metal silicide film; and etching the first polysilicon layer and the gate oxide film by use of the second-polysilicon layer pattern and the metal silicide film as a mask, thereby forming a gate which has a polycide structure consisting of the second-polysilicon layer pattern, the metal silicide film, the first-polysilicon layer pattern and the insulating film pattern.

8. The method in accordance with claim 7, wherein the gate oxide film is not etched at its portion disposed beneath the gate upon the etching thereof by virtue of the first polysilicon layer serving as an etch barrier film.

9. The method in accordance with claim 7, wherein the metal film is selected from a group consisting of W, Ta, Ti, Mo, Pt, Ni and Co.

10. The method in accordance with claim 7, wherein the metal film has a thickness of 100 to 1,000 Å.

11. The method in accordance with claim 7, wherein the first polysilicon layer has a thickness of 100 to 500 Å.

12. The method in accordance with claim 7, wherein the insulating film has a thickness of 50 to 500 Å.

13. A method for fabricating a metal oxide silicon field effect transistor, comprising the steps of:

sequentially laminating a gate oxide film, a first polysilicon layer, an insulating film, a second polysilicon layer over a semiconductor substrate, and patterning the second polysilicon layer and the insulating film in accordance with a gate patterning process, thereby forming a second-polysilicon layer pattern and an insulating film pattern, and then forming a metal film over the resulting structure;

annealing the metal film, thereby reacting the metal film with the second-polysilicon layer pattern and the first polysilicon layer which are in contact therewith, thereby forming a metal silicide film while patterning the first polysilicon layer; and anisotropically etching the metal silicide film, thereby forming metal silicide film side walls respectively on both side walls of the second-polysilicon layer pattern, thereby forming a gate which has a polycide structure consisting of the second-polysilicon layer pattern, the metal silicide film side walls, the first-polysilicon layer pattern and the insulating film pattern.

14. The method in accordance with claim 13, further comprising the step of etching the gate oxide film after the formation of the gate.

15. The method in accordance with claim 13, wherein the gate oxide film is not etched at its portion disposed beneath the gate upon the etching thereof by virtue of the first polysilicon layer serving as an etch barrier film.

16. The method in accordance with claim 13, wherein the metal film is selected from a group consisting of W, Ta, Ti, Mo, Pt, Ni and Co.

17. The method in accordance with claim 13, wherein the metal film has a thickness of 100 to 1,000 Å.

18. The method in accordance with claim 13, wherein the first polysilicon layer has a thickness of 100 to 500 Å.

19. The method in accordance with claim 13, wherein the insulating film has a thickness of 50 to 500 Å.

* * * * *